United States Patent
Kunert

(10) Patent No.: US 9,595,438 B2
(45) Date of Patent: Mar. 14, 2017

(54) METHOD FOR PRODUCING A III/V SI TEMPLATE

(75) Inventor: Bernardette Kunert, Marbug (DE)

(73) Assignee: NASP III/V GMBH, Marburg (DE)

( * ) Notice: Subject to any disclaimer, the term of this patent is extended or adjusted under 35 U.S.C. 154(b) by 396 days.

(21) Appl. No.: 13/610,407

(22) Filed: Sep. 11, 2012

(65) Prior Publication Data

US 2013/0062665 A1    Mar. 14, 2013

Related U.S. Application Data

(60) Provisional application No. 61/533,296, filed on Sep. 12, 2011.

(51) Int. Cl.
  *H01L 21/20* (2006.01)
  *H01L 21/02* (2006.01)
  (Continued)

(52) U.S. Cl.
  CPC ...... *H01L 21/0262* (2013.01); *H01L 21/0254* (2013.01); *H01L 21/02381* (2013.01);
  (Continued)

(58) Field of Classification Search
  CPC ... C30B 25/18; C30B 29/40; H01L 21/02381; H01L 21/02433; H01L 21/0245;
  (Continued)

(56) References Cited

U.S. PATENT DOCUMENTS

| 4,699,688 A | 10/1987 | Shastry |
| 5,270,247 A | 12/1993 | Sakuma et al. |

(Continued)

FOREIGN PATENT DOCUMENTS

| DE | 2313846 | 3/1973 |
| DE | 62-296510 | 12/1987 |

(Continued)

OTHER PUBLICATIONS

Heteroepitaxy of GaP on Si: Correlation of morphology, anti-phase-domain structure and MOVPE growth conditions, I. Ne'meth, B. Kunert, W. Stolz, K. Volz, Journal of Crystal Growth 310 (2008) 1595-1601.*

(Continued)

*Primary Examiner* — Michael Kornakov
*Assistant Examiner* — Hua Qi
(74) *Attorney, Agent, or Firm* — Leveque IP Law, P.C.

(57) ABSTRACT

A method for producing a monolithic template comprises a Si wafer with a layer of a III/V semiconductor epitaxially applied to its surface. The III/V semiconductor has a lattice constant differing by less than 10% from that of Si. The method includes epitaxially growing a layer of a III/V semiconductor on the surface of the Si wafer at a wafer temperature from 350 to 650° C., a growth rate from 0.1 to 2 μm/h, and a layer thickness from 1 to 100 nm. A layer of another III/V semiconductor, identical to or different from the previously applied III/V semiconductor, is epitaxially grown on the III/V semiconductor layer at a wafer temperature from 500 to 800° C., a growth rate from 0.1 to 10 μm/h, and a layer thickness from 10 to 150 nm.

12 Claims, 1 Drawing Sheet

```
┌─────────────────┐
│                 │
│      101        │
│                 │
└─────────────────┘
┌─────────────────┐
│                 │
│      100        │
│                 │
└─────────────────┘
```

(51) Int. Cl.
*C30B 25/02* (2006.01)
*C30B 25/04* (2006.01)
*C30B 25/10* (2006.01)
*C30B 25/18* (2006.01)

(52) U.S. Cl.
CPC .. *H01L 21/02433* (2013.01); *H01L 21/02458* (2013.01); *H01L 21/02461* (2013.01); *H01L 21/02543* (2013.01); *H01L 21/02581* (2013.01); *H01L 21/02658* (2013.01); *C30B 25/02* (2013.01); *C30B 25/04* (2013.01); *C30B 25/10* (2013.01); *C30B 25/18* (2013.01)

(58) Field of Classification Search
CPC ......... H01L 21/02461; H01L 21/02502; H01L 21/02543; H01L 21/0262; H01L 21/02661; H01L 21/02458; H01L 21/0254; H01L 21/02581; H01L 21/02658
See application file for complete search history.

(56) References Cited

U.S. PATENT DOCUMENTS

| | | | |
|---|---|---|---|
| 5,281,551 | A | 1/1994 | Min et al. |
| 5,937,274 | A | 8/1999 | Kondow et al. |
| 2004/0115941 | A1* | 6/2004 | Siebert ............... B82Y 15/00 438/689 |
| 2006/0115933 | A1* | 6/2006 | Ye ..................... H01L 21/02381 438/139 |
| 2006/0216947 | A1 | 9/2006 | Choi |
| 2007/0105256 | A1* | 5/2007 | Fitzgerald ......... H01L 21/76254 438/34 |
| 2008/0044932 | A1* | 2/2008 | Samoilov et al. ............... 438/5 |
| 2011/0140083 | A1* | 6/2011 | Driscoll ............. H01L 21/0237 257/15 |
| 2011/0156004 | A1* | 6/2011 | Radosavljevic ....... B82Y 10/00 257/24 |

FOREIGN PATENT DOCUMENTS

| | | |
|---|---|---|
| EP | 0297483 | 1/1989 |
| JP | S62283899 | 12/1987 |
| JP | S62296510 | 12/1987 |
| JP | S6329928 | 2/1988 |
| JP | H03500947 | 2/1991 |
| JP | H04280898 | 10/1992 |
| JP | H0714776 | 1/1995 |
| JP | H07321032 | 12/1995 |
| JP | 2001126985 | 5/2001 |
| JP | 2006216968 | 8/2006 |
| JP | H01179788 | 12/2007 |
| WO | 88/00625 | 1/1988 |
| WO | 89/04551 | 5/1989 |
| WO | WO 2006/079333 | 8/2006 |

OTHER PUBLICATIONS

Effect of two-step growth process on structural, optical and electrical properties of MOVPE-grown GaP/Si, V.K. Dixit, Tapas Ganguli, T.K. Sharma, S.D. Singh, Ravi Kumar, S. Porwal, Pragya Tiwari, Alka Ingale, S.M. Oak, Journal of Crystal Growth 310 (2008) 3428-3435.*
Effect of two-step growth process on structural, optical and electrical properties of MOVPE-grown GaP/Si, Dixit et al., Journal of Crystal Growth 310 (2008) 3428-3435.*
Heteroepitaxy of GaP on Si: Correlation of morphology, anti-phase-domain structure and MOVPE growth conditions, Nemeth et al., Journal of Crystal Growth 310 (2008) 1595-1601.*
Nemeth et al, Journal of Crystal Growth 310 (2008) 1595-1601.*
Atommic Layer Epitaxy of III-V Compounds: Chemistry and Applications Proceedings of the IEEE (Oct. 1992) No. 10, 13 pages.
Office Action in corresponding TW Application No. 101111748 with translation, 7 pages.
Sugo, et al. Growth of Antiphase-Domain-Free GaP on Si by Organometallic Vapor Phase Epitaxy, Date Apr. 2, 1988, Journal of Crystal Growth 88 (1988) pp. 229-235.
Nemeth et al., Heteroepitaxy of GaP on Si: Correlation of morphology, anti-phase-domain structure and MOVPE growth conditions, Date Apr. 1, 2008, Journal of Crystal Growth 310 (2008) 1595-1601.
Office Action dated May 5, 2015 in corresponding Singapore Application No. 2013069802, 9 pages.
Office Action in corresponding Chinese Application No. 201280016643A, mailed Jun. 19, 2015 and translation thereof, 40 pages.
Written Opinion in corresponding Singapore Application No. 2013069802, dated Nov. 20, 2015, 5 pages.
R. Luptak et al., Atomic layer deposition of HfO2 and Al2O3 layers on 300 mm Si wafers for gate stack technology. J. Vac. Sci. Technol. B, Jan. 6, 2011, vol. 29, No. 1, pp. 01A301-1-01A301-4 Whole document.

* cited by examiner

METHOD FOR PRODUCING A III/V SI TEMPLATE

STATEMENT OF RELATED APPLICATIONS

This application claims the benefit of U.S. Provisional Patent Application Ser. No. 61/533,296, filed Sep. 12, 2011, entitled "Method for Producing a III/V SI Template", which is incorporated in its entirety by reference herein.

FIELD OF THE INVENTION

The invention relates to a method for producing a III/V Si template or blank, respectively, preferably on silicon substrates of up to 300 mm (diameter) and larger, to templates produced by such a method and to the uses of such templates.

BACKGROUND OF THE INVENTION AND PRIOR ART

The enormous speed of progress in the computer and microchip technology, respectively, is based on the successful miniaturization of the individual components of an integrated circuit. An integrated circuit is basically an electronic connection of semiconductor components and passive components for data processing, said components being produced in a thin crystal layer at the surface of a silicon substrate. The number of the integrated electronic components, such as transistors, diodes, resistors and capacitors, is very high. In order to increase the performance of the micro-chips and to lower at the same time the production cost, the packing density of the components is significantly increased in every new technology generation. The most important component of an integrated circuit is the silicon-based CMOS logic with n- or p-MOS-FET transistor (complementary metal oxide semiconductor). In particular the physical properties of silicon and silicon dioxide have allowed a substantial reduction of the transistor size in the last decades. Correspondingly, the transistor density in the microchip development could be doubled every 24 months.

Transistors are basically resistances controlled by an external gate voltage (voltage at the control electrode). Crucial performance characteristics of these components are high clock rates and a low heat dissipation in operation. Up to now, these performance characteristics could be improved by the structure reduction of the transistors. In the meantime, however, the individual component dimensions are so small that fundamental physical limits are reached and further miniaturization will not lead to an improvement. Meanwhile, besides silicon and silicon dioxide, new materials are used at this place for producing integrated circuits, the physical properties of said materials leading to an improvement of the component functionality.

In particular, the use of III/V semiconductor materials in the CMOS technology is discussed. The class of the III/V semiconductor crystals is composed of 50% each of the chemical elements of group III and group V. The binding properties of the respective chemical elements determine the electronic and optical properties of the III/V semiconductor compound. Since the composition options within the class of the III/V semiconductor materials is very large, correspondingly very different semiconductor components can be achieved. The integration of III/V semiconductor layers on Si-based integrated circuits allows on the one hand improving existing functionalities, such as the application of III/V channel layers for transistors. On the other hand, novel device concepts can be obtained, such as the integration of III/V laser diodes for optical data processing on the microchip level.

Another crucial point for the application of new materials for improving the performance of the integrated circuits is the integration process. Herein it is important, despite novel materials and/or device concepts, to keep the production costs low. Contrary to hybrid integration approaches (see for instance EP 0297483), the monolithic growth of III/V semiconductor layers on Si substrates is a very inexpensive method. Herein, the III/V semiconductor mixed crystal is directly connected with the silicon carrier substrate (see as examples only U.S. Pat. No. 5,937,274 or PCT/DE 2006/000140).

Because of the different material class of silicon and III/V semiconductors, the following aspects have to be taken into account for the monolithic connection: The atomic binding properties of silicon and of the III/V class elements are very different, consequently most III/V crystals have a lattice constant different from that of silicon. The difference of the lattice constants will in turn lead to the formation of dislocation defects during the precipitation of a III/V film on Si. Besides, an interdiffusion at the boundary between silicon and the III/V crystal and/or contamination effects during the crystal growth may lead to a doping in the respective host crystal that is difficult to control.

Another problem is caused by the different crystal base of Si and III/V crystals: If the Si surface comprises non-atomically double-layer stepped Si terraces, anti-phase defects will be formed in the III/V film. Since the 80s, the monolithic integration of III/V layers on silicon was investigated. Basically, the above challenges for the III/V precipitation on small Si substrates of up to 2 inch diameter are solved, however the formation of dislocations during the integration of III/V materials with lattice constants different from that of silicon still complicates the realization of highly efficient components with sufficient life.

Because of the different crystal base of silicon and III/V mixed crystals, anti-phase defects in the III/V layer may very quickly be formed during the monolithic precipitation. These defects in turn impair the operating properties of the components. The formation of anti-phase defects can be avoided by the specific preparation of the silicon surface.

An anti-phase-free III/V integration is possible, if by a special substrate pretreatment double-steps of two Si atomic layers each are produced. This surface preparation is however preferably possible on slightly dislocated [(001) 2° to 6° off in the <110> direction] substrates. In the document B. Kunert, I. Németh, S. Reinhard, K. Volz, W. Stolz, Thin Film Solid 17 (2008) 140, the defect-free precipitation of GaP on exactly oriented substrates was shown for the first time, however the substrate specification is still subject to an additional requirement: (001) (smaller than)<0.15° off in the <110> direction.

Since today's Si-based CMOS technology is very complex and advanced, the integration of new materials must be matched very precisely with the CMOS production process. Any larger intervention or change of the current CMOS process would significantly increase the development costs. The CMOS standard Si substrate specification with respect to the orientation is (001)+/−0.5 off in an arbitrary direction. The conversion of the CMOS technology to dislocated [(001) 2° to 6° off in the <110> direction] substrates would however by much too expensive and uneconomical due to the renewed adjustment of the process.

The above-mentioned substrate specification of (001) <0.15° off in the <110> direction would however fall into the specification of the CMOS process. However, due to this small dislocation, the specific wafer sawing process is very complicated and expensive and is still a big technological challenge. In the meantime, the Si substrate size in the actual CMOS technology is a diameter of 300 mm (some factories work with an even smaller wafer). The mass production of 300 mm Si wafers with a dislocation of <0.15° in the <110> direction would however drastically increase the production costs, and then the application of these substrates would be economically questionable. Therefore, in particular the antiphase-free III/V integration on 300 mm Si substrates is an unsolved technological and economical problem for the CMOS process.

Another technological challenge is caused by the different thermal expansion coefficients of silicon and the compounds of the III/V semiconductor crystals. When the different dependence of the lattice constants on the temperature is not systematically taken into account in the integration process, dislocations or cracks may be formed in the III/V layer. For large substrate diameters, the Si wafer may even be affected (wafer flipping) and form relaxation defects.

TECHNICAL OBJECT OF THE INVENTION

Figure 2:
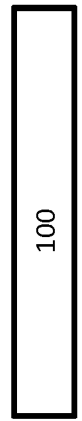
FIG. 2 illustrates Si wafer after step A), wherein the contaminant layer 101 is removed.
Figure 4:
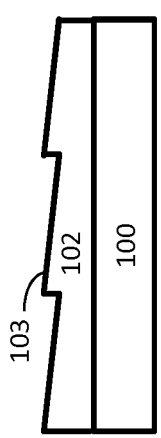
FIG. 4 illustrates wafer 100 covered by Si layer 103 after etching in step C), wherein a double-step surface 103 is formed.
Figure 6:
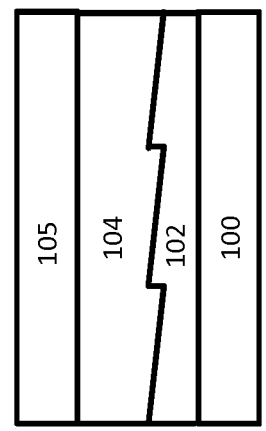
FIG. 6 illustrates Si wafer 100 after the growth of the another layer of III/V semiconductor in step E).
Figure 1:
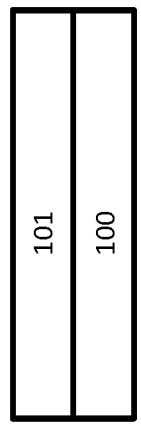
FIG. 1 illustrates a Si wafer 100 covered by a contaminant layer 101.
Figure 3:
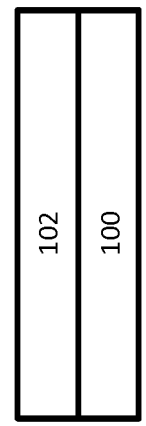
FIG. 3 illustrates wafer 100 after growth of the Si epitaxial layer 102 in step B)
Figure 5:
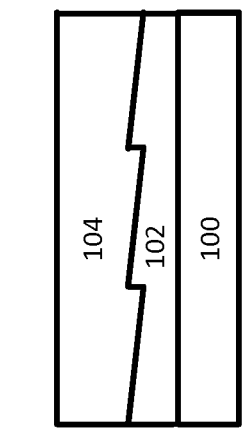
FIG. 5 illustrates Si wafer 100 after the growth of the layer of III/V semiconductor 104 in step D)

It is therefore the technical object of the invention to propose a method for producing a monolithic III/V Si template having minimal dislocation defects, minimal antiphase defects, and allowing the use of comparatively large Si wafers with diameters of 200 mm, 300 mm or larger that optionally may have a mask structure.

BASICS OF THE INVENTION

For achieving this technical object, the invention teaches a method for producing a monolithic template comprising a Si wafer with a layer of a III/V semiconductor epitaxially applied on a surface of the Si wafer, the III/V semiconductor having a lattice constant, which differs by less than 10% from that of Si, comprising the following steps: A) optionally, the surface of the Si wafer is deoxidized, B) optionally, a Si layer is epitaxially grown on the surface of the deoxidized Si wafer, C) optionally, the surface of the Si wafer or the surface of the Si layer is subjected to a baking-out step and/or an etching step, D) a layer of a III/V semiconductor is epitaxially grown on the surface of the Si wafer or a surface formed during one of steps A) to C) at a wafer temperature from 350 to 650° C., a growth rate from 0.1 to 2 μm/h, and a layer thickness from 1 to 100 nm, E) a layer of a III/V semiconductor, identically with or differently from the III/V semiconductor applied in step D), is epitaxially grown on the layer obtained in step D) at a wafer temperature from 500 to 800° C., a growth rate from 0.1 to 10 μm/h, and a layer thickness from 10 to 150 nm.

The invention thus comprises a special method of the crystalline precipitation of group IV materials as well as III/V semiconductor compounds on Si substrates, these Si substrates having a diameter of 200 mm, 300 mm and more and optionally being structured by means of masking. The crystal precipitation or the crystal growth, respectively, typically takes place by means of gas phase epitaxy. With this process, the integration of a thin dislocation-free III/V semiconductor layer on Si substrate is intended and ideally also achieved.

At the beginning of the process, the Si substrates can be baked out in a first process step, in order to remove the silicon dioxide from the surface. In the next step, a silicon buffer can be precipitated if required. Depending on the integration concept, this silicon buffer can be doped. The Si substrate surface with or without additional buffer layer is for instance, but not necessarily specially prepared, depending on the crystal dislocation (off or exactly oriented). The precipitation of steps D) and E) occurs in two process steps: First a thin III/V film is grown at low temperatures (step D)) and then the reactor temperature is significantly increased for the further crystal precipitation (step E)). The composition of the III/V layer is adjusted, depending on layer thickness and growth temperature, in order to avoid the formation of dislocations and cracks or reduce them as far as possible.

Contrary to most other III/V mixed crystals, the monolithic integration of thin GaP layers on Si substrate is possible without the formation of dislocation defects, since the two crystals have a similar lattice constant. Thus the application of GaP as a first III/V nucleation layer is technologically very important, since this also appreciably simplifies the further integration of materials with a different lattice constant. This GaP/Si template can consequently be used for very different III/V materials and (electronic) component concepts on Si microelectronics. At present, various enterprises, institutes and universities work on specific integration concepts under application of a GaP/Si template.

The invention allows for the first time the precipitation of practically dislocation-free III/V semiconductor materials on exact and dislocated silicon substrate having a diameter of up to 300 mm. In the process design, it has also been taken into account that before the precipitation of III/V materials, a silicon buffer with arbitrary doping can be realized. This step is particularly helpful, in order on one hand to optimize the substrate surface, to permit selective silicon overgrowth in particular for a mask structuring process and to precipitate adjusted Si contact layers for the standard CMOS metallization. The use of 300 mm wafers corresponds to today's Si-based CMOS technology, thus the integration method on corresponding wafers permits maximum compatibility with the current development state of the CMOS technology.

Furthermore, by the use of 300 mm substrates, an ideal cost effectiveness of the production costs is assured. In particular since the process has been realized in an epitaxy system that is connected with an automatic disc handler, and thus an automatic substrate transfer is possible.

Besides the application of the invention in the Si microtechnology, the precipitation of III/V materials on large-area Si substrates is advantageous for other applications, too. It is the intention here to benefit of the fact that Si substrates are significantly less expensive compared to conventional III/V substrates, and that larger substrate discs can also be produced.

By the integration of conventional III/V-based components such as LEDs, detectors or solar cells on Si substrates, the production costs could significantly be reduced. At this point, the use of dislocated ((001) 2° to 6° off in the <110> direction) Si substrates would also be possible.

In particular, the following preferred variants of the method according to the invention are described.

The surface to be coated of the Si wafer is preferably a (001) Si surface, with 0 to 6°, in particular 0 to 2°, dislocation in the direction <110>. In addition, the Si wafer may have a mask structure. For a dislocation of ≤1°, the direction of the dislocation may differ from <110>.

Step A) can be carried out by baking-out to a wafer temperature from 800 to 1,200° C., in particular 900 to 1,100° C., for instance 950 to 1,050° C., for a time from 1 s to 30 min, in particular a time from 1 to 30 min, for instance 5 to 15 min, in an inert gas atmosphere. The inert gas atmosphere can be nitrogen or hydrogen. The (total) gas pressure may be in the range from 50 to 1,000 mbar, preferably 100 to 300 mbar. The total gas flow may be in the range from 6 to 200 l/min, in particular 6 to 50 l/min, for instance 40 to 50 l/min.

In step B) the Si layer can be grown at a wafer temperature from 600 to 1,200° C., in particular from 725 to 1,100° C., for instance from 850 to 1,050° C., a growth rate from 0.01 to 20 μm/h, in particular 1 to 10 μm/h, for instance 3 to 10 μm/h, and a layer thickness from 0 to 5 μm, in particular 0.1 to 2 μm, for instance 0.5 to 1.5 μm. The inert gas atmosphere may be nitrogen or hydrogen under additional use of a gaseous Si educt. Optionally, a doping with B, Ga, P, Sb and/or As in a p- or n-doping concentration of $10^{15}$ to $10^{21}$ $cm^{-3}$, for instance $10^{17}$ to $10^{21}$ $cm^{-3}$ is carried out. The (total) gas pressure may be in the range from 50 to 1,000 mbar, preferably 100 to 300 mbar. The total gas flow may be in the range from 6 to 200 l/min, in particular 6 to 50 l/min, for instance 40 to 50 l/min.

In step C), an inert gas or protective gas (for instance $N_2$ or Ar), respectively, or an active gas can be conducted at a wafer temperature from 600 to 1,200° C., in particular 725 to 1,100° C., for instance 850 to 1,050° C., for a time from 0 to 60 min, in particular 0 to 15 min, for instance 1 to 10 min, over the surface at an etching rate from 0 to 5 μm/h, preferably 0 to 2 μm/h. As active gas, for instance HCl or hydrogen may be used (remainder: for instance nitrogen). The (total) gas pressure may be in the range from 50 to 1,000 mbar, preferably 600 to 900 mbar. The total gas flow may be in the range from 6 to 200 l/min, in particular 6 to 50 l/min, for instance 10 to 15 l/min.

In step D), a $Ga_xB_yAl_zP$ or a $GaN_wP_v$ semiconductor can be grown, wherein x=0–1, y=0 to 0.1 and z=0–1, or w=0–0.1 and v=1–w, in particular x=1, y=0 and z=0, wherein the sum of x, y and z for $Ga_xB_yAl_zP$ is always 1. The wafer temperature may preferably be in the range from 400 to 625° C., in particular 420 to 500° C. The III/V growth rate may be in the range from 0.1 to 2 μm/h, in particular 0.5 to 1.5 monolayers/s, for instance 1 monolayer/s. The growth mode may be continuous, preferably by means of flow rate modulation epitaxy (FME) and by means of atomic layer precipitation (ALD), what can also be used for the layers generally or specially described otherwise. The layer thickness preferably is in the range from 2 to 50 nm, in particular 2 to 8 nm. The gas proportion V/III may be in the range from 5 to 200, in particular 10 to 150, for instance 50 to 70. The (total) gas pressure may be in the range from 50 to 1,000 mbar, preferably 50 to 500 mbar, in particular 50 to 150 mbar. The total gas flow may be in the range from 6 to 200 l/min, in particular 6 to 60 l/min, for instance 40 to 60 l/min. Optionally, a doping with Zn, Te, S, C, Mg and/or Si takes place in a p- or n-doping concentration of $10^{15}$ to $10^{21}$ $cm^{-3}$, for instance $10^{17}$ to $10^{21}$ $cm^{-3}$. The procedure can however also be made without doping.

In step E), a $Ga_xB_yAl_zP$ or a $GaN_wP_v$ semiconductor can be grown, wherein x=0–1, y=0–0.1 and z=0–1, or w=0–0.1 and v=1–w, in particular x=0–1, y=0–0.06 and z=0–1, wherein the sum of x, y and z for $Ga_xB_yAl_zP$ is always 1. The wafer temperature may preferably be in the range from 525 to 725° C., in particular 650 to 700° C. The III/V growth rate may be in the range from 0.1 to 10 μm/h, in particular 0.5 to 5 μm/h, for instance 2 to 2.5 μm/h. The layer thickness preferably is in the range from 30 to 100 nm, in particular 40 to 70 nm. The gas proportion V/III may be in the range from 5 to 200, in particular 10 to 100, for instance 10 to 30. The (total) gas pressure may be in the range from 50 to 1,000 mbar, preferably 50 to 900 mbar, in particular 50 to 150 mbar. The total gas flow may be in the range from 6 to 200 l/min, in particular 6 to 60 l/min, for instance 40 to 60 l/min. Optionally, a doping with Zn, Te, S, C, Mg and/or Si takes place in a p- or n-doping concentration of $10^{15}$ to $10^{21}$ $cm^{-3}$, for instance $10^{17}$ to $10^{21}$ $cm^{-3}$. The procedure can however also be made without doping.

The invention furthermore relates to a monolithic template, obtainable by means of a method according to the invention. It also relates to the use of such a template for the monolithic integration of components based on III/V semiconductor layers such as transistors, laser diodes, LEDs, detectors and solar cells on a Si substrate, in particular on a Si substrate having a diameter of more than 6 cm, preferably more than 10 cm, in particular more than 20 cm. Subsequently to step E), further III/V semiconductor layers can be epitaxially grown and electronic components comprising III/V semiconductor can be formed.

In the following, the invention is explained in more detail by means of non-limiting examples representing embodiments only.

EXAMPLE 1

Employed Devices

Crystal precipitation takes place by means of gas phase epitaxy. For this purpose, an epitaxy system is required that allows the crystal growth on 300 mm (diameter) Si substrates. Furthermore, the temperature distribution of the susceptor can be radially varied in the method, in order to precisely adjust the temperature profile of the Si wafer. Preferably, the CCS (Close Couple Showerhead) Crius system from Aixtron is used.

All described process steps can be carried out in a single epitaxy reactor. In order to minimize contamination effects or to adjust the integration method to further process steps, two epitaxy reactors may also be used. Therein, an optional substrate transfer after process step C) and/or D) is recommended.

EXAMPLE 2

Employed Substances or Gases, Respectively

The following educts or precursors, respectively, can be employed in the process:

Educts for silicon: silane, di-chlorsilane, di-silane, tri-silane, neopenta-silane, tetra-chlorosilane ($SiCl_4$), di-tertiary-butyl-silane (DitButSi).

Educts for gallium: tri-ethyl-gallium (TEGa), tri-methyl-gallium (TMGa), tri-tertiary-butyl-gallium.

Educts for boron: tri-ethyl-borane (TEB), tri-tertiary-butyl-borane, di-borane, borane-amine adducts such as di-methyl-aminoborane.

Educts for aluminium: tri-methyl-aluminium (TMAl), tri-tertiary-butyl-aluminium, amine adducts such as di-methyl-aminoaluminium.

Educts for phosphorus: tertiary-butyl-phoshine (TBP), phosphine.

Educts for arsenic: tertiary-butyl-arsine (TBAs), arsine, tri-methyl-arsine (TMAs).

Educts for antimony: tri-ethyl-antimony (TESb), tri-methyl-antimony (TMSb).

Educts for doping the III/V layer: di-ethyl-tellurium (DETe), di-methyl-zinc (DMZn), di-ethyl-zinc (DEZn), dit-ButSi, silane, di-tertiary-butyl-sulfide, bis-cyclopentadi-enyl-magnesium, tetra-bromomethane.

Cl-containing educts: HCl, di-chlorsilane, $SiCl_4$.

Nitrogen or hydrogen is used as carrier gases.

The following educts are preferred: silane, di-silane, di-chlorosilane, HCl, TEGa, TEB, TMAl and TBP. The preferred carrier gas is hydrogen.

EXAMPLE 3

GaP on Exact Silicon (001)

As an example of execution, the precipitation of a thin GaP layer on 300 mm silicon substrate is described. In this example, the Si substrate is p-doped and exact-oriented. The GaP-layer is 50 nm thick and n-doped in the range of $3*10^{18}$ $cm^{-3}$. The following educts are used: silane, TEGa, TBP, and DETe.

The Si wafer is transferred by means of an automated disc-transfer system from Brooks into a CCS Crius reactor from Aixtron. Purified hydrogen is used as carrier gas, whereas silane, TEGa, TBP and DETe are available as educts for Si, Ga, P and Te.

In the first step, the native silicon dioxide is removed from the substrate surface in a 10-minute baking-out step (step A). The reactor pressure is 200 mbar, the total gas flow is 48 l/min, and the wafer temperature is 1,000° C.

For the precipitation of a 1 μm-thick Si buffer (step B)), the following growth parameters are adjusted: reactor pressure 200 mbar, total gas flow 48 l/min, wafer temperature 900° C. Under these conditions, a silane flow of 8.9E-4 mol/min will lead to a growth rate of 4 μm/h.

After the buffer growth, the silicon surface is prepared (step C)). For this purpose, a HCl flow of 5.4E-3 mol/min for 5 min into the reactor is effected. This surface treatment initiates the formation of double-layer stepped Si terraces, in order to minimize the formation of anti-phase defects. The reactor pressure is 700 mbar and the total flow is 12 l/min.

The following nucleation of the GaP-layer again necessitates the adjustment of the growth conditions: The wafer temperature in step D) is reduced to 450° C., and a reactor pressure of 100 mbar and a total gas flow of 48 l/min are adjusted. The mole flows of the III/V educts are 2.52E-4 mol/min for TEGa and 1.51E-2 mol/min for TBP. In the first step of the III/V nucleation, TBP is fed for 10 s into the reactor (TBP preflow). Then follows the GaP growth per FME (flow rate modulation epitaxy). This means in particular that after the TBP preflow, the following educt switching sequence for the reactor is repeated several times: 1 s growth interruption without educts ->1 s TEGa ->1 s growth interruption without educts ->1 s TBP. This switching loop is repeated 22 times, and thereby 6 nm GaP are precipitated. The TEGa mole flow is adjusted such that in one second the wafer surface is covered with one monolayer Ga.

In the next step (step E)), the wafer temperature is increased to 675° C. under TBP stabilization. Further, new mole flows for the educts are adjusted: 5.81E-4 mol/min for TEGa and 1.16E-2 mol/min for TBP. Thereby, the V/III proportion is reduced from 60 to 20. The gas phase proportion DETe/TEGa is adjusted such that at 675° C. an n-doping of $3*10^{18}$ $cm^{-3}$ is achieved. A GaP layer of 44 nm is precipitated with a growth rate of 2.3 μm/s. This GaP/Si template is then cooled down under TBP stabilization.

These process parameters can also be used for (001) Si wafers with a dislocation of up to 2° off in the <110> direction.

EXAMPLE 4

GaP on (001) Silicon, 2° off in the <110> Direction of the Si Wafer

As an example of execution, the precipitation of a thin GaP layer on 300 mm silicon substrate is described. In this example, the Si substrate is p-doped and has a dislocation of 2° off in the <110> direction. The GaP-layer thickness is 50 nm. The following educts are employed: silane, TEGa, and TBP.

The Si wafer is transferred by means of an automated disc-transfer system from Brooks into a CCS Crius reactor from Aixtron. Purified hydrogen is used as carrier gas, whereas silane, TEGa, and TBP are available as educts for Si, Ga, and P.

In the first step, the native silicon dioxide is removed from the substrate surface in a 10-minute baking-out step (step A). The reactor pressure is 200 mbar, the total gas flow is 48 l/min, and the wafer temperature is 1,050° C.

For the precipitation of a 1 μm-thick Si buffer (step B)), the following growth parameters are adjusted: reactor pressure 200 mbar, total gas flow 48 l/min, wafer temperature 1,050° C. Under these conditions, a silane flow of 8.9E-4 mol/min will lead to a growth rate of 8.3 μm/h.

A step C) is not carried out in this Example, step D) immediately follows.

The following nucleation of the GaP-layer again necessitates the adjustment of the growth conditions: The wafer temperature in step D) is reduced to 450° C., and a reactor pressure of 100 mbar and a total gas flow of 48 l/min are adjusted. The mole flows of the III/V educts are 2.52E-4 mol/min for TEGa and 1.51E-2 mol/min for TBP. In the first step of the III/V nucleation, TBP is fed for 10 s into the reactor (TBP preflow). Then follows the GaP growth per FME (flow rate modulation epitaxy). This means in particular that after the TBP preflow, the following educt switching sequence for the reactor is repeated several times: 1 s growth interruption without educts ->1 s TEGa ->1 s growth interruption without educts ->1 s TBP. This switching loop is repeated 22 times, and thereby 6 nm GaP are precipitated. The TEGa mole flow is adjusted such that in one second the wafer surface is covered with one monolayer Ga.

In the next step (step E)), the wafer temperature is increased to 675° C. under TBP stabilization. Further, new mole flows for the educts are adjusted: 5.81E-4 mol/min for TEGa and 1.16E-2 mol/min for TBP. Thereby, the V/III proportion is reduced from 60 to 20. A GaP layer of 44 nm is precipitated with a growth rate of 2.3 m/s. This GaP/Si template is then cooled down under TBP stabilization.

These process parameters can also be used for (001) Si wafers with a dislocation of up to 6° off in the <110> direction.

The invention claimed is:

1. A method for producing a monolithic template comprising a Si wafer with a layer of a III/V semiconductor epitaxially applied on a surface of the Si wafer, the III/V semiconductor having a lattice constant, which differs by less than 10% from that of Si, comprising:
   epitaxially growing a Si layer on the surface of the Si wafer at a wafer temperature from 600 to 1200° C., a growth rate 0.01-20 µm/h, and a thickness of the Si layer up to 5 µm;
   after growing the Si layer and before precipitation of III/V semiconductor on the Si layer, preparing a surface of the Si layer by conducting an active Cl-containing gas over a surface of the Si layer at a wafer temperature from 600 to 1,200° C. for a time up to 60 min for etching the Si layer at an etching rate up to 5 µm/h to form double-layer stepped Si terraces that minimize formation of anti-phase defects between the Si layer and subsequently formed III/V semiconductor material;
   epitaxially growing a first layer of the III/V semiconductor on the surface of the Si layer at a wafer temperature from 350 to 650° C., a growth rate from 0.1 to 2 µm/h, and a layer thickness of the first layer of the III/V semiconductor from 1 to 100 nm; and
   epitaxially growing on the surface of the first layer of the III/V semiconductor a second layer of a III/V semiconductor, identical to or different from the first layer of the III/V semiconductor at a wafer temperature from 500 to 800° C., a growth rate from 0.1 to 10 µm/h, and a layer thickness of the second layer of the III/V semiconductor from 10 to 150 nm;
   the epitaxially growing the first and second layers of III/V semiconductor performed subsequent to the preparation of the surface of the Si layer, and
   the epitaxially growing the second layer of III/V semiconductor performed subsequent to the epitaxially growing the first layer of III/V semiconductor and performed at a higher temperature than the epitaxially growing the first layer of III/V semiconductor.

2. The method according to claim 1, wherein before epitaxially growing the Si layer, baking-out the surface of the Si wafer to a wafer temperature from 800 to 1,200° C. for a time from 1 s to 30 min in an inert gas atmosphere.

3. The method according to claim 1, wherein epitaxially growing the first layer of the III/V semiconductor on the surface of the Si layer is epitaxially grown by atomic layer deposition (ALD).

4. The method according to claim 1, wherein the surface of the Si wafer is a (001) Si surface with 1 to 6° misorientation in the direction <110>.

5. The method according to claim 1, wherein the first layer of the III/V semiconductor is a $Ga_xB_yAl_zP$, wherein x=0–1, y=0–0.1 and z=0–1, wherein the sum of x, y and z for $Ga_xB_yAl_zP$ is always 1.

6. The method according to claim 1, wherein the first layer of the III/V semiconductor is a $GaN_wP_v$ semiconductor, wherein w=0–0.1 and v=1–w.

7. The method according to claim 1, wherein the second layer of the III/V semiconductor is a $Ga_xB_yAl_zP$, wherein x=0–1, y=0–0.1 and z=0–1, and wherein the sum of x, y and z for $Ga_xB_yAl_zP$ is always 1.

8. The method according to claim 1, wherein the second layer of the III/V semiconductor is a $GaN_wP_v$ semiconductor, wherein w=0–0.1 and v=1–w.

9. The method according to claim 1, wherein the first layer of the III/V semiconductor is doped with Zn, Te, S, C, Mg and/or Si at a doping concentration of $10^{15}$-$10^{21}$ cm$^3$.

10. The method according to claim 1, wherein the second layer of the III/V semiconductor is doped with Zn, Te, S, C, Mg and/or Si at a doping concentration of $10^{15}$-$10^{21}$ cm$^3$.

11. The method of claim 1, wherein the substrate further comprising using the template with a mask structure having a diameter greater than 20 cm.

12. The method of claim 1, where the Si wafer having a diameter of 200 mm or larger.

* * * * *